United States Patent
Hayashi et al.

(10) Patent No.: US 6,779,144 B2
(45) Date of Patent: Aug. 17, 2004

(54) SEMICONDUCTOR INTEGRATED CIRCUIT DEVICE AND METHOD OF TESTING IT

(75) Inventors: Hideki Hayashi, Ome (JP); Keiichi Higeta, Hamura (JP); Shigeru Nakahara, Musashimurayama (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 404 days.

(21) Appl. No.: 09/996,722

(22) Filed: Nov. 30, 2001

(65) Prior Publication Data

US 2002/0069382 A1 Jun. 6, 2002

(30) Foreign Application Priority Data

Dec. 6, 2000 (JP) .......................................... 2000-371585

(51) Int. Cl.$^7$ ................................................ G01R 31/28
(52) U.S. Cl. ........................ 714/731; 714/727; 714/728
(58) Field of Search .......................... 714/729, 30, 731, 714/733, 726, 727, 728; 327/99

(56) References Cited

U.S. PATENT DOCUMENTS

| 5,173,906 | A | | 12/1992 | Dreibelbis et al. ......... 371/22.5 |
|---|---|---|---|---|
| 5,349,587 | A | * | 9/1994 | Nadeau-Dostie et al. ... 714/729 |
| 5,557,619 | A | | 9/1996 | Rapoport .................... 371/22.5 |
| 5,680,543 | A | * | 10/1997 | Bhawmik ..................... 714/30 |
| 6,442,722 | B1 | * | 8/2002 | Nadeau-Dostie et al. ... 714/731 |
| 6,452,426 | B1 | * | 9/2002 | Tamarapalli et al. .......... 327/99 |
| 6,671,842 | B1 | * | 12/2003 | Phan et al. ................. 714/733 |
| 6,687,865 | B1 | * | 2/2004 | Dervisoglu et al. ......... 714/726 |

FOREIGN PATENT DOCUMENTS

JP 2614413 2/1997

\* cited by examiner

*Primary Examiner*—David Ton
(74) *Attorney, Agent, or Firm*—Miles & Stockbridge P.C.

(57) ABSTRACT

A semiconductor integrated circuit device includes a test circuit including a first latch circuit for holding a test pattern input to an electronic circuit operating in accordance with a clock signal and a second latch circuit for holding the output signal of the electronic circuit corresponding to the test pattern. In the test circuit, the clock signal having a frequency higher than the noise frequency generated in the power line at the time of starting to supply the clock signal to the electronic circuit is continuously supplied to the electronic circuit and the test circuit, while at the same time performing, in accordance with the clock signal in a period longer than the period of the clock signal, the operation of inputting the test pattern to the first latch circuit and the operation of outputting the output signal held in the second latch circuit.

14 Claims, 10 Drawing Sheets

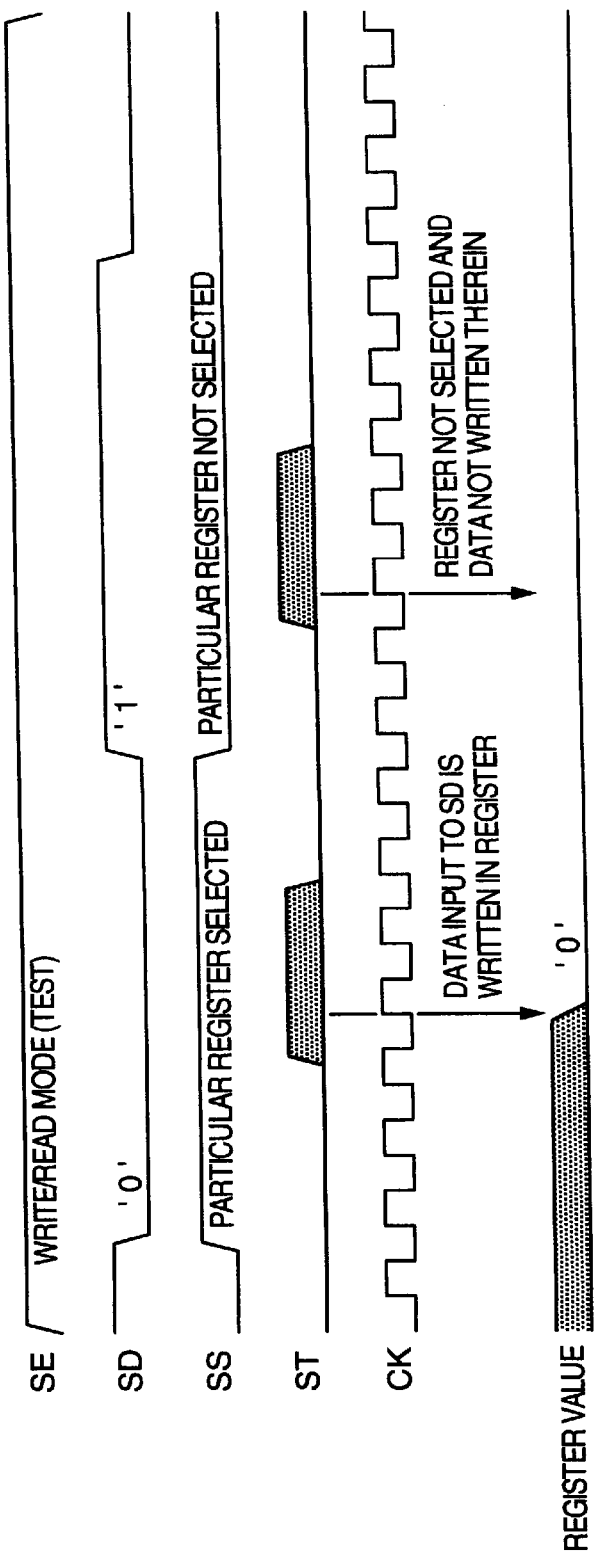

SEMICONDUCTOR INTEGRATED CIRCUIT DEVICE AND METHOD OF TESTING IT

BACKGROUND OF THE INVENTION

The present invention relates to a semiconductor integrated circuit device and a method of testing the same, or in particular to a large-scale integrated circuit device operated by a high-frequency clock signal and a technique effectively utilized for a method of testing the device.

U.S. Pat. No. 5,173,906 issued on Dec. 22, 1992, JP-B-2614413 (corresponding to JP-A-7-93998) issued May 28, 1997 and U.S. Pat. No. 5,557,619 issued on Sep. 17, 1996 each disclose a method of testing the RAM (random access memory) mounted on a large-scale integrated circuit (LSI) using a built-in self test (hereinafter referred to as "BIST") circuit. The test methods proposed in these patents use a BIST circuit including a flip-flop circuit FF with a scan circuit. According to this these test methods, (1) the BIST circuit for the RAM (hereinafter referred to as "RAM-BIST circuit") is set using a scan circuit, (2) the RAM is tested by applying a clock of a frequency beyond the processing capacity of an evaluation tester to the LSI using the RAM-BIST, and (3) the test result is recovered using the scan circuit (in low frequency cycles).

In the prior art, as described above, the RAM is tested in cycles of a clock frequency beyond the processing capacity of the evaluation tester in such a manner that a clock is first applied with a frequency that can be processed by the evaluation tester, the registers of the RAM-BIST circuit are set and then the clock cycles are increased to a high frequency at which the RAM is to be tested. As an alternative, after the clock is stopped, the clock of the desired frequency is applied anew and the RAM test is conducted. Also, in order to recover the result of the RAM test, the frequency of the clock cycles at which the RAM is tested is decreased to the cycles of the frequency which can be processed by the evaluation tester. As still another alternative, after the clock is stopped, the clock of frequency cycles which can be processed by the evaluation tester is applied anew and the value of the registers storing the RAM test result is recovered.

SUMMARY OF THE INVENTION

With the increase in the density and the operating speed of each element in the LSI, the noises of the power supply for LSI operation are on the increase. The present inventors have discovered that a large power noise is generated by the abrupt impedance change of the LSI with respect to the power supply at the time of starting or stopping the clock application. This power noise may unduly rewrite the data of the registers in the LSI. In the case where a register write error is caused by the power noise, therefore, the information set in the RAM-BIST circuit for the RAM is destroyed and the normal test operation becomes impossible. The information on the test result is also destroyed and the correct test result cannot be obtained. In other words, the well-known cases described above fail to take any protective measure against the operation error due to the power noise generated by the supply or stop of the clock signal or the change in clock frequency.

The study by the inventors shows that the power noise is generated at the time of stopping/starting the clock probably by the following facts. As described above, with the increase in density of the LSI and the resulting sharp increase in the number of the flip-flop circuits FFs mounted on the LSI (i.e. the number of the elements connected to the clock signal), an increased amount of current is consumed at the time of starting to supply the clock signal due to the high density of the LSI. The power noise (the fluctuation of the source voltage or the grounding potential) is proportional to the product of the change in current consumption and the impedance of the power supply system. Specifically, the greater the change in power consumption or the higher the impedance of the power system, the larger the power noise. When testing the LSI completed on a semiconductor wafer, power is supplied by "applying a probe" or the like method, and therefore the impedance of the power system is often higher than when the LSI is used with an actual product. Thus, the power noise poses a more serious problem.

The present inventors have encountered the problem of the power noise while developing a most sophisticated product. The experiments conducted by the inventors show that a power noise of about 10 MHz having an amplitude of 0.7 V is generated for a source voltage of 1.5 V the instant the clock signal begins to be supplied. In the environment where this power noise is generated, the data stored in the internal registers of the LSI is destroyed and it becomes difficult to conduct a correct LSI test. This indicates that the power noise cannot be reduced by the conventional approach in which the frequency is switched slowly to a lower value that can be processed by the evaluation tester. In order to radically reduce the power noise by reducing the impedance of the power system, it is common practice to embed a high-pass capacitor for reducing the power noise in the LSI. This would result in occupation of a great area on the chip and fails to provide a satisfactory solution.

The present inventors have taken note of the fact that the frequency of the power noise of the LSI having an increased density and an improved performance is low relative to the operation cycles of the LSI. In other words, the inventors have found that the noise generated the instant the clock signal begins to be supplied has a frequency of about 10 MHz as described above, and in the case where a clock signal of about 500 MHz to 800 MHz sufficiently higher than 10 MHz is supplied to the LSI, the noise generated in the power line is as small as several tens of mV. This reduction in noise amplitude is probably due to the fact that the power noise "cannot follow" the operating frequency of the clock signal which is higher than the resonance frequency (about 10 MHz) in a resonance circuit having a parasitic capacitance, a parasitic inductance component and a wiring resistance at the power terminal. Actually, it has been confirmed by experiments that the power noise measured with the LSI operating frequency of 800 MHz is as small as about several tens of mV. Taking advantage of this fact, the present inventors have come to develop a method of testing a high-density, high-performance semiconductor integrated circuit device.

An object of the present invention is to provide a semiconductor integrated circuit device having a high density, a high performance and a high reliability and a method of testing it.

Another object of the invention is to provide a semiconductor integrated circuit device having a high density, a high performance and a high reliability and a method of testing the device with a shorter testing time.

The above and other objects and novel features of the invention will be made apparent by the detailed description taken in conjunction with the accompanying drawings.

According to one aspect of the invention, there is provided a semiconductor integrated circuit device comprising a test circuit including a first latch circuit for holding a test pattern inputted to an electronic circuit operating in accordance with the clock signal and a second latch circuit for holding an output circuit of the electronic circuit corresponding to the test pattern, wherein the electronic circuit and the test circuit are supplied continuously with a clock signal having a higher frequency than the noise frequency generated in the power line at the time of starting to supply the clock signal to the electronic circuit, while at the same time performing the operation of inputting the test pattern to the first latch circuit and the operation of outputting the output signal held in the second latch circuit, in accordance with the clock signal with a period longer than the period of the clock signal.

According to another aspect of the invention, there is provided a method of testing a semiconductor integrated circuit device comprising a test circuit including a first latch circuit for holding a test pattern inputted to an electronic circuit operating in accordance with the clock signal and a second latch circuit for holding an output circuit of the electronic circuit corresponding to the test pattern, wherein the electronic circuit and the test circuit are supplied continuously with a clock signal having a higher frequency than the noise frequency generated in the power line at the time of starting to supply the clock signal to the electronic circuit, while at the same time performing the operation of inputting the test pattern to the first latch circuit and the operation of outputting the output signal held in the second latch circuit, in accordance with the clock signal with a period longer than the period of the clock signal.

BRIEF DESCRIPTION OF THE DRAWINGS

FIG. 4 is a timing chart for explaining an example of the operation of the registers shown in FIGS. 3A to 3C.

DESCRIPTION OF THE EMBODIMENTS

Figure 1:
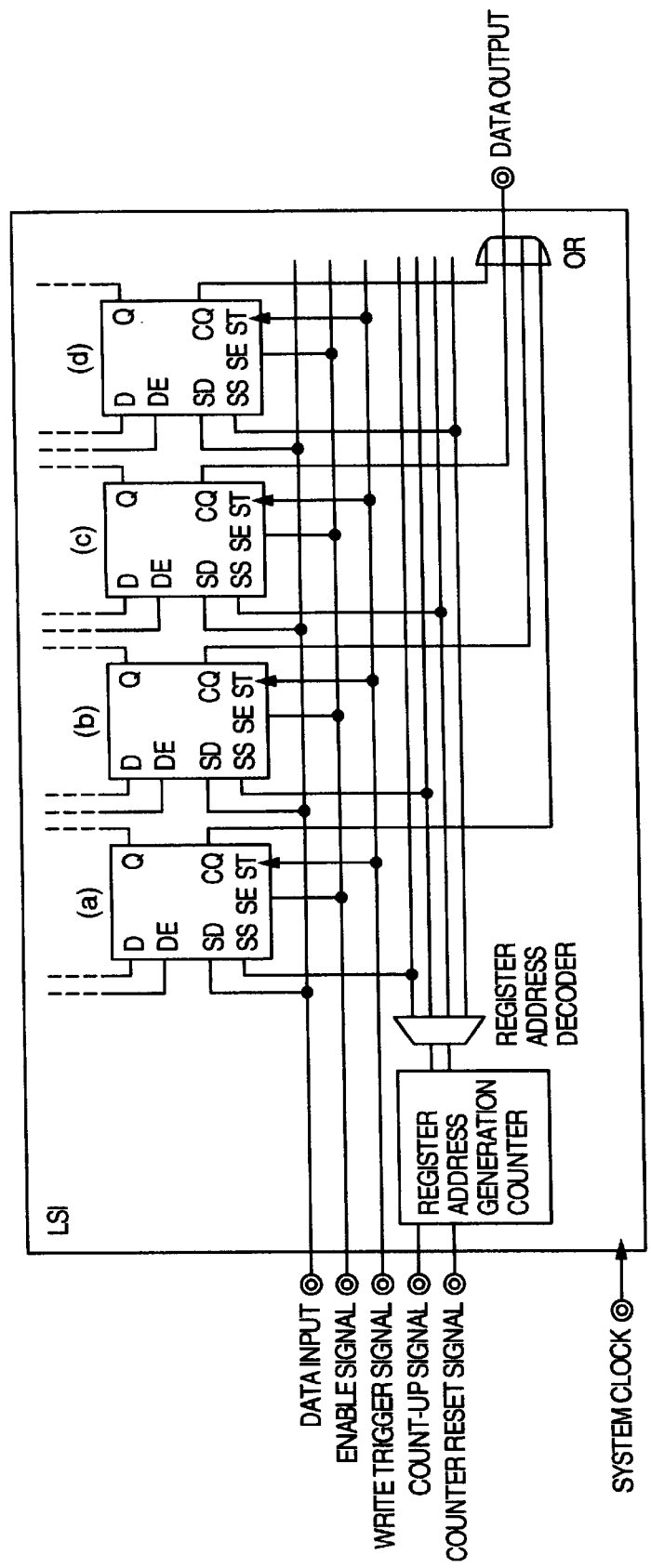
FIG. 1 is a schematic block diagram showing a test circuit included in a semiconductor integrated circuit device according to an embodiment of the invention.

A block diagram of a test circuit included in a semiconductor integrated circuit device according to an embodiment of the invention is schematically shown in FIG. 1. The test circuit according to this embodiment includes registers (a) to (d) for directly inputting a test pattern to an internal circuit (electronic circuit) such as a logic circuit or a memory circuit (not shown) formed in a LSI making up a semiconductor integrated circuit device, a register address generation counter constituting a circuit for selecting any of the registers, and a register address decoder.

The registers (a) to (d) have the function as a flip-flop circuit inserted between the input and output of a logic circuit which may be tested, or the function as a flip-flop circuit for holding the input signal and the output signal of a memory circuit which may be tested, and the function of retrieving the input of a test pattern for the test operation, the output signal of the logic circuit corresponding to a test pattern or, as the case may be, the read signal of a memory circuit corresponding to the test pattern.

A data input signal, an enable signal, a write trigger signal, a count-up signal and a counter reset signal make up input signals for the test. In the case where the register address generation counter is reset by a counter reset signal and the count-up signal is supplied, a register address is generated for selecting the registers (a) to (d) in accordance with the counting operation of the register address generation counter. The register address decoder decodes the register address and forms a signal for selecting the registers (a) to (d), for example, in accordance with the counting operation.

The SD (set data) input terminals of the registers (a) to (d) are connected to each other and supplied with the data input signal. The SE (set enable) terminals of the registers (a) to (d), on the other hand, are connected to each other and supplied with the enable signal described above. Also, the ST (set trigger) terminals of the registers (a) to (d) are connected to each other and supplied with a trigger signal. The SS (set select) terminals of the registers (a) to (d) are supplied with the register select signals, respectively, formed by the register address decoder. The semiconductor integrated circuit device constituting the LSI is supplied with the system clock.

Upon validation of the enable signal, the registers (a) to (d) are set in test mode. The register address generation counter is reset by the counter reset signal described above, and the count-up signal is supplied thereby to select the registers (a) to (d) sequentially. A test pattern is input from the data input terminals in accordance with the count-up signal, and the write trigger signal is supplied. Then, the serially input test pattern is written sequentially in the registers (a) to (d).

Upon invalidation of the enable signal, on the other hand, the registers (a) to (d) input the test pattern to the logic circuit or the memory circuit to be tested and hold the output signal corresponding to the test pattern. This operation is performed as a sequence operation in response to the system clock.

Assume that the enable signal is validated to set the registers (a) to (d) in test mode again, that the register address generation counter is reset by the counter reset signal as described again, and that the registers (a) to (d) are sequentially selected by supplying them with the count-up signal. Then, the data outputs are produced serially through an OR circuit in accordance with the count-up signal. The OR circuit can be configured as a wired logic with the CQ (capture data output) terminals of the registers (a) to (d) connected to each other.

The embodiment shown in FIG. 1 represents an example of a write/read control circuit using a register circuit. This makes possible the read or write operation for any of the registers (a), (b), (c) and (d) in which a value is required to be set before carrying out the built-in self test (BIST) of a RAM or any of the registers (a), (b), (c) and (d) from which a value is required to be read after carrying out the built-in self test of a RAM, for example. Any of the registers (a) to (d) is selected by supplying the SS terminal of a particular register with the high-level (H) signal formed by the register address generation counter and the register address decoder. A system clock input pin is connected with a high-speed pulse generator and supplied with clock pulses of an arbitrary frequency required for the RAM test. In contrast, the pins for the data input signal, the enable signal, the write trigger signal, the count-up signal, the counter reset signal and the data output signal are connected to a LSI tester and controlled in cycles of the frequency capable of being processed by the LSI tester.

Figure 2:
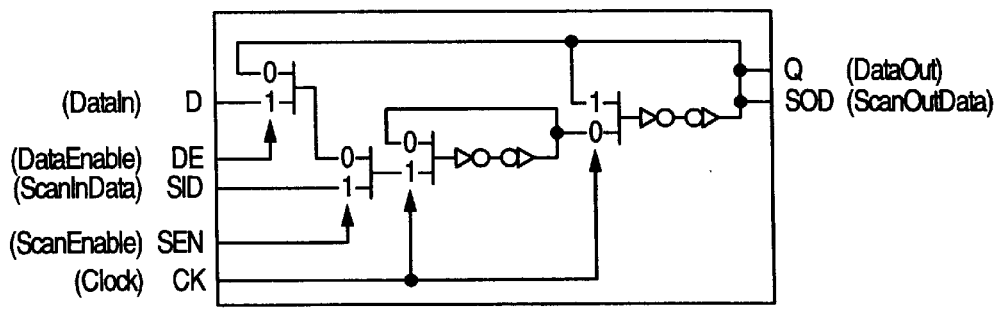
FIG. 2 is a circuit diagram showing a basic circuit of a register used in an embodiment of the invention.

FIG. 2 is a circuit diagram showing a basic circuit of a register used in an embodiment of the invention. All the registers used in this embodiment are a flip-flop (FF) supplied with a data enable (DE) signal of MUX-SCAN type capable of automatic diagnosis. The flip-flop FF of MUX-SCAN type is employed to make possible the coexistence of the logic diagnosis method and the test circuit or the test method according to the invention. Therefore, the LSI diagnosis method is not limited to MUX-SCAN, but other diagnosis method (such as the LSSD type) may alternatively be employed. Also, unless the LSI diagnosis is required, a FF free of diagnosis can be used.

In FIG. 2, the SEN (scan enable) terminal, the SID (SCAN-IN data) terminal and the SOD (SCAN-OUT data) terminal are pins required for automatic diagnosis of MUX-SCAN type. Reference character CK designates a system clock for the LSI. These pins are not fully shown hereinafter for simplifying the explanation.

In FIG. 2, when the DE (data enable) signal is raised to high level (logic "1"), the multiplexer retrieves the signal from the D (data-in) terminal, while when the DE signal is at low level (logic "0"), the Q (data-out) signal is retrieved. When the SEN (scan enable) terminal is raised to high level (logic "1"), the multiplexer retrieves the signal from the SID (SCAN-IN data) terminal, while when the SEN terminal is at low level (logic "0"), the D or Q signal is retrieved. With the CK (clock) raised to high level (logic "1"), the latch circuit on the input stage side is set in through state to retrieve the input data while setting the latch circuit on the output stage side in latched state thereby to hold the just retrieved data. With the CK reduced to low level (logic "0"), the latch circuit on the input stage side is set in latched state thereby to hold the retrieved data, while the latch circuit on the output stage side is set in through state thereby to retrieve the output signal on input stage side.

The registers shown in FIG. 1 are for retrieving and holding the signal from the data terminal D in accordance with the clock signal CK when DE and SEN are set to logic "0", and execute the normal logic sequence. When the DE and DEN are set to logic "1", on the other hand, the SCAN-IN of the test pattern from SID and the SCAN-OUT of the data held can be executed.

Figure 3A:
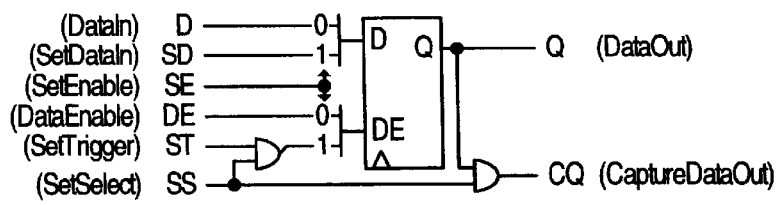
FIGS. 3A to 3C are block diagrams showing specific examples of the registers used in an embodiment of the invention.
Figure 3B:
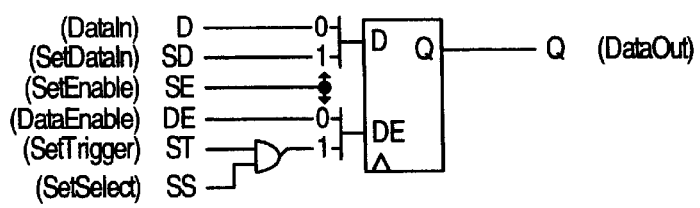
Figure 3C:
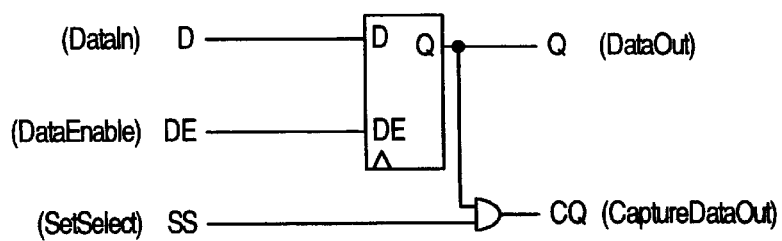

FIGS. 3A to 3C are block diagrams showing the registers used in an embodiment of the invention. FIG. 3A shows a writable/readable register, FIG. 3B a writable register, and FIG. 3C a readable register. The writable/readable register shown in FIG. 3A can be supplied with a test pattern and can retrieve the output signal corresponding to the test pattern. The writable register shown in FIG. 3B is used in the case where only the input signal is supplied to the circuit to be tested like the address signal for the memory circuit. The readable register shown in FIG. 3C is used in the case where only the output signal of a logic circuit or a memory circuit is retrieved.

In each of FIGS. 3A to 3C, the portion indicated by the block is configured of the circuit shown in FIG. 2. In FIGS. 3A to 3C, only the terminals D, DE and Q are typically illustrated, whereas the terminals SID, SEN and SOD for the SCAN-IN or SCAN-OUT operation described above are not shown. The clock terminal is indicated by a triangle.

In FIG. 3A, two multiplexers and two OR gates are added. Specifically, the D (data in) signal and the SD (set data in) signal are input to the D terminal of the register through the multiplexer controlled by the SE (set enable signal). Also, the DE (data enable) signal and the logic sum of the ST (set trigger) signal and the SS (set select) signal are supplied to the DE terminal of the register through the multiplexer controlled by the SE (set enable) signal. The Q (data out) signal from the register is output as a CQ (capture data out) signal through an OR gate controlled by the SS (set select) signal.

In FIG. 3B, the circuit for outputting the CQ (capture data out) signal is deleted from the configuration shown in FIG. 3A.

In FIG. 3C, the circuit for inputting the SE and ST signals is deleted from the configuration of FIG. 3A.

The registers shown in FIGS. 3A to 3C set the BIST circuit and controls the operation of reading the test result in accordance with the system clock and the SE, ST and SS signals lower in frequency than the system clock. Specifically, while applying the system clock continuously to the registers at high speed, the registers are written into or read from in cycles of the frequency capable of being processed by the LSI tester in the same manner as if asynchronously with the system clock as described above. This operation performed in cycles of the frequency capable of being processed by the LSI tester in the same manner as if asynchronously with the system clock is expressed as "the pseudo clock asynchronous operation" for convenience' sake.

The configuration shown in FIG. 3A can be employed for all the registers making up the RAM-BIST circuit. For minimizing the circuit size and the layout size, however, it is rational to use the circuits of FIGS. 2, 3A to 3C selectively by classifying the registers into those required to be written into, those required to be read from, those required to be both written into and read from and those required neither to be written into nor read from.

The operation of writing into the registers shown in FIGS. 3A to 3C will be explained. The SE (set enable) signal is for selecting whether the registers perform the normal operation or the pseudo clock asynchronous write operation. In the case where a low ("L") signal is input as the SE signal, the registers perform the normal operation. Specifically, the circuit of FIG. 3 is equivalent to the circuit of FIG. 2 in the case where a "L" signal is input to the registers of FIGS. 3A to 3C. In the case where a "H" signal is input as the SE signal, on the other hand, the "pseudo clock asynchronous write" mode described above is entered, in which neither the signal D nor DE is accepted.

The SD (set data in) signal represents the data to be written into the registers in the "pseudo clock asynchronous write" mode. In other words, a signal (test pattern) to be written is input as the SD signal. The SS (set select) signal is for selecting the registers in the "pseudo clock asynchronous write" mode. Specifically, any of the registers is selected when the SS signal is at high ("H") level. The ST (set trigger) signal is for triggering the write operation for the registers in the "pseudo clock asynchronous write" mode. Specifically, when the pulse input is at high ("H") level, the data input as the SD signal is written into the registers.

FIG. 4 shows a timing chart for explaining an example operation of the registers shown in FIGS. 3A to 3C. It should be noted that the CK (system clock) input signal not shown in FIGS. 3A to 3C is shown in the timing chart of FIG. 4. The core portion of the registers shown in FIGS. 3A to 3C is identical to that of FIG. 2, and therefore the registers shown in FIGS. 3A to 3C are also synchronized by the clock.

In the circuits shown in FIGS. 3A to 3C, as obvious from the timing chart of FIG. 4, the write operation for the registers is not performed in other than the case where the SS signal is "H" (the registers selected) and the ST signal is "H" (the write operation permitted) at the same time. It is seen, therefore, that if the ST signal is handled like an operation trigger signal, the circuits of FIGS. 3A to 3C can be controlled by the cycle of the trigger pulse of the ST signal regardless of the operating frequency of the system clock CK in the case where the "H" pulse width of the ST signal is sufficiently larger than the cycle of the system clock CK.

As described above, even when the clock CK of fast cycles such as 500 MHz to 800 MHz is applied, the aforementioned "pseudo clock asynchronous write" control operation can be realized with a low frequency capable of being processed by the LSI tester without reducing the clock frequency.

In FIG. 4, the write/read mode (test mode) with the SE signal at high ("H") level corresponds to the "pseudo clock asynchronous write mode" described above. A test pattern is input as the SD signal (logic "0"), and a register is selected with the SS signal set to high level. When the ST signal is raised to high level, the logic "0" of the SD signal is written in the register in synchronism with the clock signal CK. In the process, the frequency of the clock CK is so high that the logic "0" constituting the test pattern input as the SD signal is written a plurality of times in synchronism with the clock CK during the period when the ST signal is at high level. In this way, the same data is written several times.

In the case where the SD signal is raised to high level (logic "1") and the SS signal reduced to low level not to select the registers, the registers are not selected even when the ST signal is raised to high level. Therefore, the test pattern of high level (logic "1") input as the SD signal is not written. Specifically, in such a case, the test pattern of logic "1" input as the SD signal is written in another register selected by the SS signal a plurality of times in synchronism with the clock signal CK. In response to the sequential selection of the registers in accordance with the address scan by the SS signal described above, the test pattern input as the SD signal is set serially in the registers.

Figure 5:
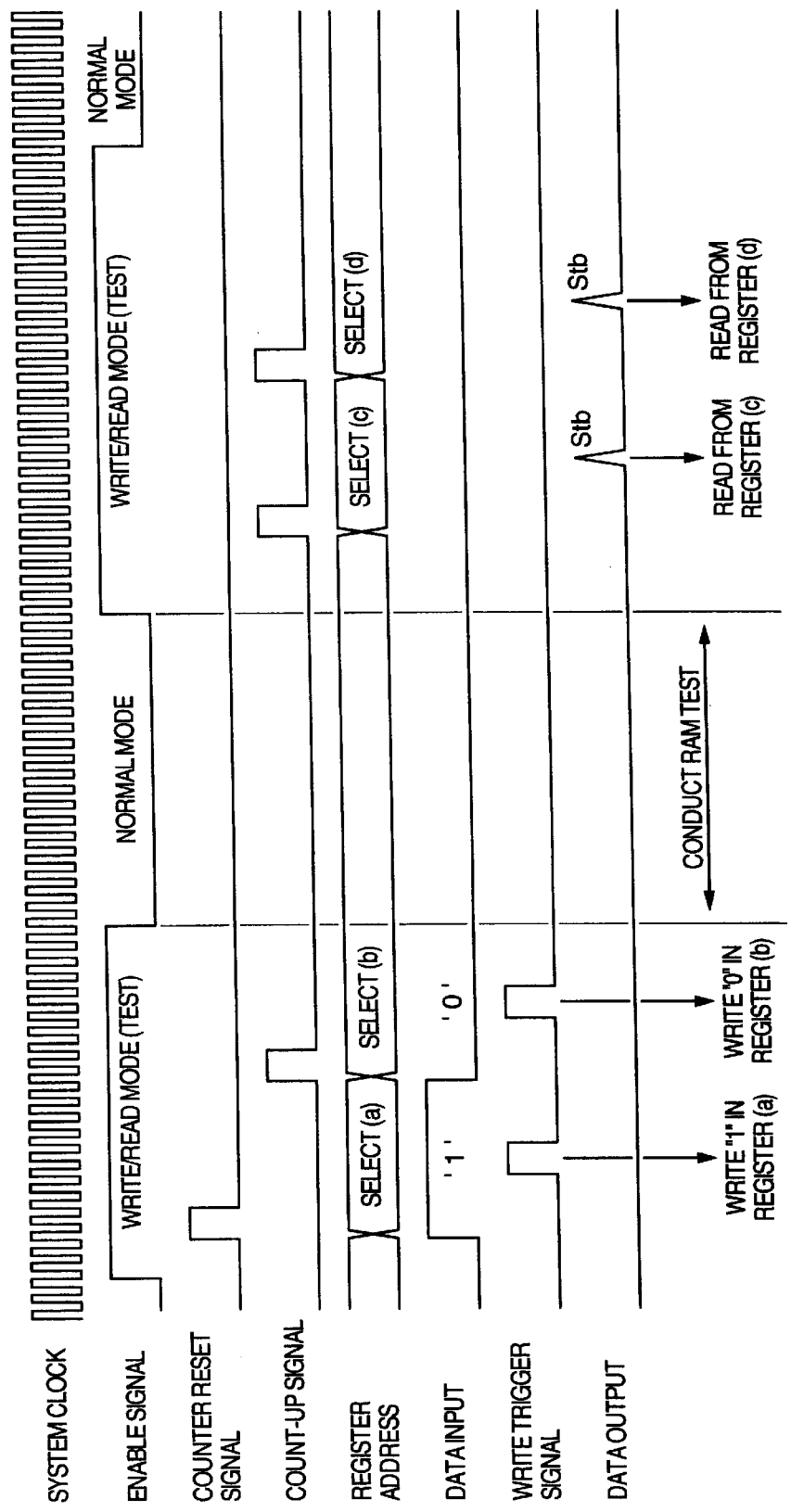
FIG. 5 is a timing chart for explaining an example of the operation of the circuit according to the embodiment shown in FIG. 1.

FIG. 5 is a timing chart for explaining an example of the operation of the circuit according to the embodiment shown in FIG. 1. As long as the enable signal is at high level, the write/read mode (test mode) prevails. During this period, under the "pseudo clock asynchronous write" control described above, a register address is generated by the counter reset signal and the counter up signal corresponding to the cycles of the frequency capable of being processed by the LSI tester. Thus, the registers (a) and (b) are sequentially selected, and in response, the test pattern of logic "1" and "2" and the write trigger signal are input as data input. As a result, the register (a) is supplied with a test pattern of logic "1", and the register (b) with the test pattern of logic "0", both serially.

When the enable signal is reduced to low level, the normal mode comes to prevail and the RAM test is carried out. Specifically, the RAM is accessed in accordance with the test patterns set in the registers (a) and (b). As the result of this memory access, the read data are output to the registers (c) and (d), for example.

When the enable signal is raised to high level again, the write/read mode (test mode) comes to prevail. Under the "pseudo clock asynchronous read" control described above, the register address is generated by the counter up signal corresponding to the frequency cycles capable of being processed by the LSI tester, and the registers (c) and (d) are selected sequentially. In accordance with this select operation, the read signal corresponding to the test pattern is serially output from the data output terminal.

According to the embodiments shown in FIGS. 1 and 5, the control pins for the enable signal and the write trigger signal and the data output pin are constituted of LSI pins directly controlled and the output thereof determined by the LSI tester. As an alternative, these control pins and the data output pin can be indirectly controlled through a JTAG interface, for example.

Figure 6A:
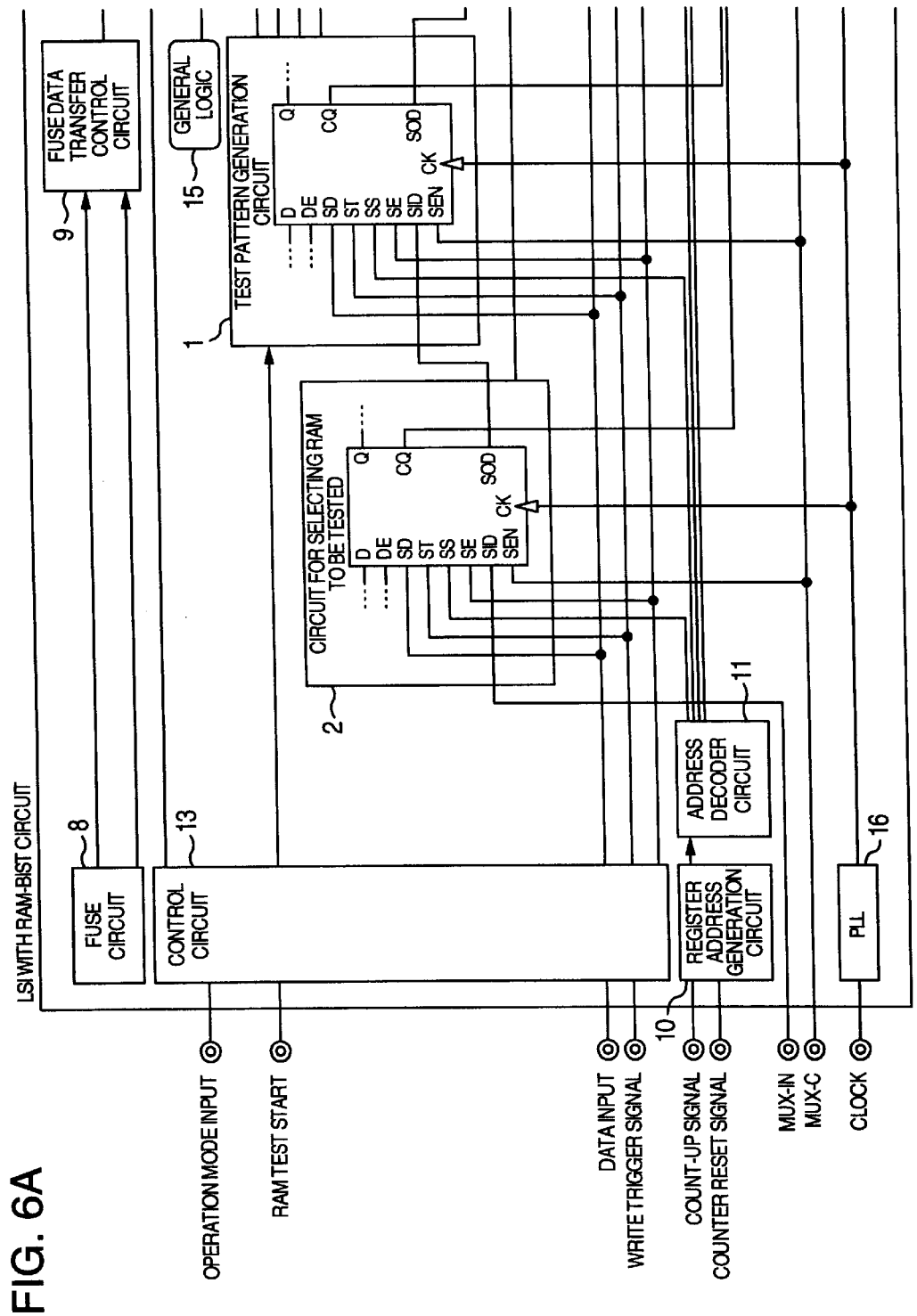
FIGS. 6A and 6B represent a block diagram showing a semiconductor integrated circuit device according to an embodiment of the invention.
Figure 6B:
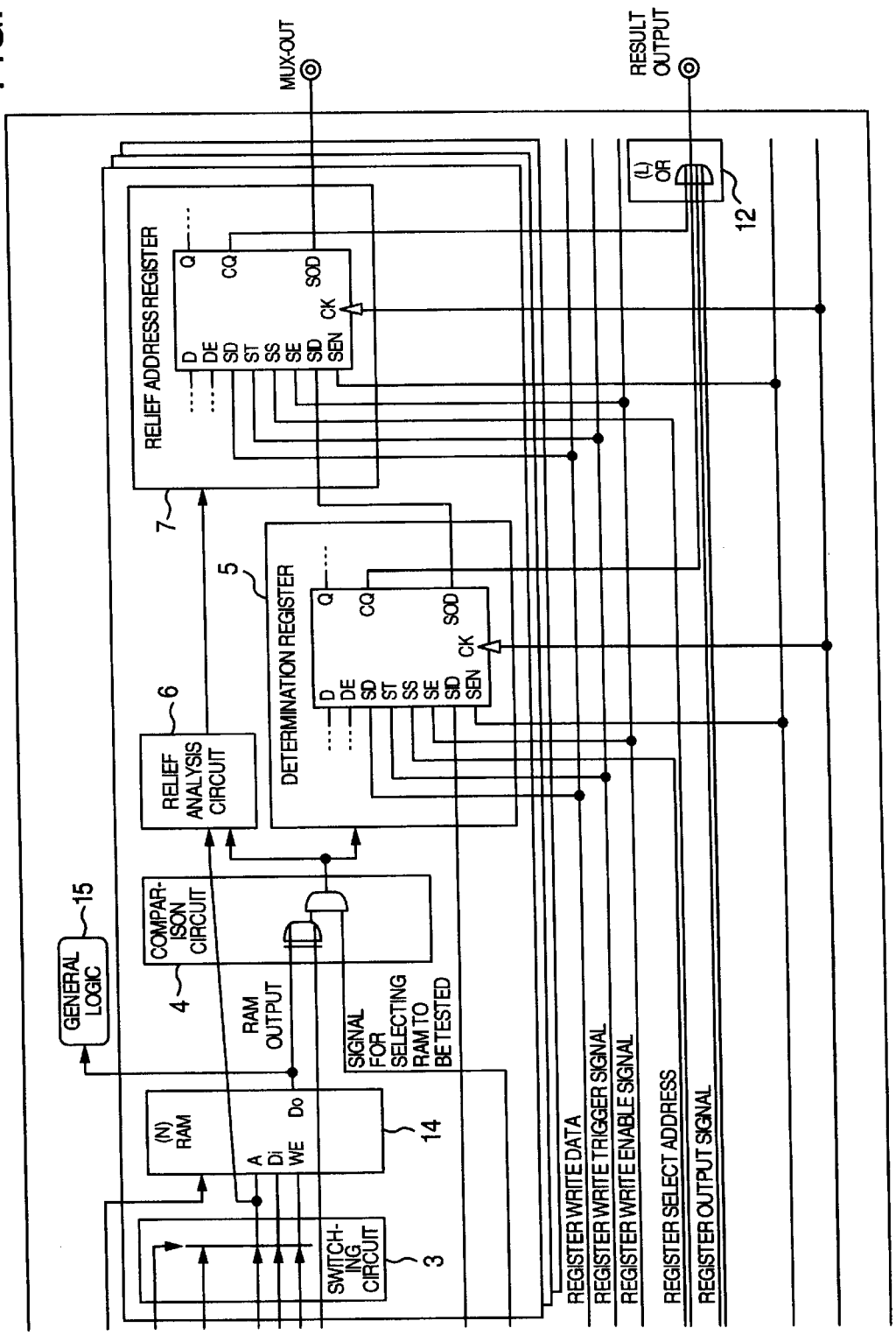

FIGS. 6A and 6B represent a block diagram showing a semiconductor integrated circuit device according to another embodiment of the invention. This embodiment is applicable to a semiconductor integrated circuit device having a RAM-BIST circuit built therein. The semiconductor integrated circuit device according to this embodiment is configured of the circuit blocks described below.

Reference numeral 1 designates a RAM test pattern generating circuit, and numeral 2 a circuit for selecting a RAM to be tested. Specifically, in the case where a plurality of RAMs are mounted in a single semiconductor integrated circuit device, the test is conducted by sequentially changing the RAMs designated by the tested RAM select circuit described above using the test pattern generated by the same test pattern generating circuit 1 for each RAM.

Numeral 3 designates a switching circuit for switching between the test operation and the system operation. Specifically, the switching circuit 3 switches between the normal memory access to the RAM 14 using the signal formed by the general logic and the memory access to the RAM 14 using the the test pattern generated by the test pattern generating circuit 1. Numeral 4 designates a comparison circuit for comparing the RAM output with an expected output value which is formed by the test pattern generating circuit 1. Numeral 5 designates a determination register for storing the result of determination (test result) by the comparison circuit 4.

Numeral 6 designates a relief analysis circuit for calculating a RAM defect relief method (relief address) using a fuse based on a defective RAM address. The relief address calculated by the relief analysis circuit 6 is stored in a relief address register 7. Numeral 8 designates a fuse circuit for storing a defective address. A fuse data transfer control circuit 9 transfers the defective address data of the fuse circuit to the RAM 14.

Numeral 10 designates a register address generating circuit for generating an address signal for the tested RAM select circuit 2, the test pattern generating circuit 1 and registers including the determination register 5 and the relief address register 7. An address decoder circuit 11 forms the register select signal by decoding the address signal. Numeral 12 designates an OR circuit for calculating the logic sum of the output signals of the registers and producing the result of register selection. Numeral 13 designates a control circuit for controlling the operation of each element circuit of the RAM-BIST circuit. The RAM 14 is a memory circuit to be tested. Character PLL designates a circuit for forming a system clock used to conduct a test according to the MUX-SCAN method based on MUX-IN and MUX-C by selectively dividing the clock frequency.

The RAM-BIST circuit shown in FIGS. 6A and 6B is controlled in whole by the control circuit 13. The control circuit 13, in turn, is controlled by an operation mode select signal. The RAM is tested by the BIST circuit shown in FIGS. 6A and 6B as follows. First, the system clock is applied. An arbitrary clock frequency such as a high frequency corresponding to the actual operating frequency is employed for the RAM test and continuously supplied till the end of operation of the BIST circuit.

The operation is set to "the register setting mode". For conducting the RAM test by the RAM-BIST circuit, conditions (test pattern) are set for the registers of each circuit described below. The contents of the test pattern generated are set in the RAM test pattern generating circuit 1. A RAM (in the case where a plurality of RAMs are involved) to be tested is selected by the tested RAM select circuit 2. The test operation is set in the switching circuit 3. The determination register 5 and the relief address register are initialized. The input pin SE of each register (FIGS. 3A to 3C) is set to "H" level into the "pseudo clock asynchronous write" mode. The setting of the register address generating circuit 10 and the method of writing into the registers are described above.

The operation is set to "the RAM test mode". The input pin SE of the registers (FIGS. 3A to 3C) is set to low level "L" into the "normal operation" mode. As a result, the RAM 14 is accessed by the test pattern generated in the test pattern generating circuit 1. According to the embodiment shown in FIGS. 6A and 6B, a RAM test start trigger signal is provided so that the RAM test can be started by inputting the "H" pulse.

In the RAM test pattern generating circuit 1, a test pattern is generated, the test operation is selected by the switching circuit 3, the RAM output is compared with an expected output value by the comparison circuit 4, and the comparison or determination result (test result) is stored in the determination register 5. The relief analysis circuit 6 calculates the defective RAM address relief address and the calculated relief address is stored in the relief address register 7. In the "RAM test mode", all the circuits operate at the frequency of the clock CK.

The operation is set to "the register recovery mode". The result of the RAM test conducted by the RAM-BIST circuit is determined by reading the register value of each circuit. The conforming/defective product information is read from the determination register 5, and the relief address from the relief address register 7. The high level "H" is set at the input pin SE of each register (FIGS. 3A to 3C), and the "pseudo clock asynchronous operation" mode comes to prevail. As long as the "H" level signal is not applied to the ST pin of the registers, the contents of the registers are not rewritten. The setting of the register address generating circuit and the method of reading from the registers are described already. Then, the operation is set to "the system operation mode". In response, the switching circuit 3 selects the normal system operation so that the normal system operation is started.

As described above, according to this embodiment, all the operations of the RAM-BIST circuit can be performed while continuing to apply a clock of a predetermined frequency ceaselessly. As a result, the RAM test can be conducted with a stable power supply without being affected by the power noises caused when starting, stopping or changing the speed of the clock.

Also, according to this embodiment, the operation test of the control circuit for the RAM-BIST circuit can be performed by the diagnosis method of MUX-SCAN type. The basic circuit shown in FIG. 2 includes the diagnosis circuit of MUX-SCAN type which can be used as it is.

According to this embodiment, in order to conduct the LSI test in a "quiet environment" with as small power noises as possible, the clock is continuously applied at high speed (i.e. in actual operation cycles) and the power supply is stabilized before starting the test. The very operation of "conducting a test" in cycles of high speed, however, is not an easy matter. A memory tester having the test capability of 800 MHz is not yet available. The development of such a memory tester would involve a vast amount of investment and therefore will not be cost effective.

Originally, the BIST circuit was introduced to conduct the LSI test at a high frequency using a tester of low capability. With the power supply kept stable by applying the clock continuously, the RAM test can be controlled and carried out and the test result can be recovered with a low-speed tester. In this way, an ultra high-speed LSI and a RAM-BIST circuit suitable therefor can be provided. As described above, according to this invention, while the clock of high-speed cycles is kept applied for the RAM test, the operation of setting the RAM-BIST circuit, the RAM test operation and the operation of recovering the test result can be continuously carried out without stopping or changing the speed of the clock. Thus, the RAM-BIST operation can be carried out with a stable power supply, i.e. without causing any malfunction of the registers which otherwise might be caused by the power noises.

This embodiment can be implemented within the framework of the LSI logic diagnosis method (such as MUX-SCAN method), and the operation of the RAM-BIST circuit can be checked using the LSI logic diagnosis method. The clock operation is carried out continuously in high-speed cycles (actual operation cycles of the LSI) to stabilize the LSI power supply. In other words, while supplying the clock signal of a high frequency that cannot be followed by the resonance circuit included in the power system, the generation of large noises at about the resonance frequency is suppressed to create an environment with minimum power noises.

The LSI can be tested by the control operation (setting the BIST circuit for the test and reading the test result) at low frequencies using a tester having a low capability as compared with the operating speed of the LSI to be tested by providing control means operated "asynchronous" with the clock, i.e. means for "slow control operation". With this tester capability, the data are often input and output at about the resonance frequency of the power circuit. The test circuit and the test method according to this invention can fully exhibit the performance as a test circuit without operating at a lower frequency by avoiding the resonance frequency band, and therefore the test time can be shortened effectively.

More specifically, if the tester data are input or output at a frequency lower than the resonance frequency, the test time is lengthened correspondingly. In the case where the frequency of the clock signal is lowered or changed to input/output the data at such a low frequency, the power noise would be generated as described above with the result that the test pattern or the determination result cannot be held in the registers. The present invention can obviate such a problem.

As in this embodiment, the high-speed operation of the LSI using a low-speed test device requires means for supplying at least a system clock of high frequency to the LSI.

According to this embodiment, the high-frequency clock signal of about 800 MHz described above is generated by a PLL circuit 16 built in the LSI. In the case where the frequency dividing ratio of the PLL circuit 16 is set to 16, for example, a high-frequency clock signal of about 800 MHz can be generated on LSI side even when the low-speed test device has only the ability to supply the clock signal of 50 MHz, thereby making possible the operation with a high-speed clock.

As described above, the PLL circuit 16 built in the LSI can easily generate a system clock of a frequency multiplied from the low-speed clock signal of the test device, and the LSI can be operated easily. It is, however, very difficult to attain exact synchronism between the system clock generated in the PLL circuit 16 and the signal of the low-speed test device. According to this embodiment, however, the test can be realized with this configuration since the RAM-BIST circuit can be controlled asynchronously with the clock signal.

In view of the above-mentioned fact that the RAM-BIST circuit can be controlled asynchronously with the clock signal, the PLL circuit 16 included in the aforementioned embodiment may be replaced with a combination of a low-speed test device and a device for supplying only the clock at high speed, i.e. a pulse generating circuit. The pulse generating circuit (pulse generator) for generating a pulse signal of a frequency as high as several GHz can be acquired at a comparatively low price, and therefore the test device including the pulse generating circuit can be produced relatively inexpensively.

Figure 7A:
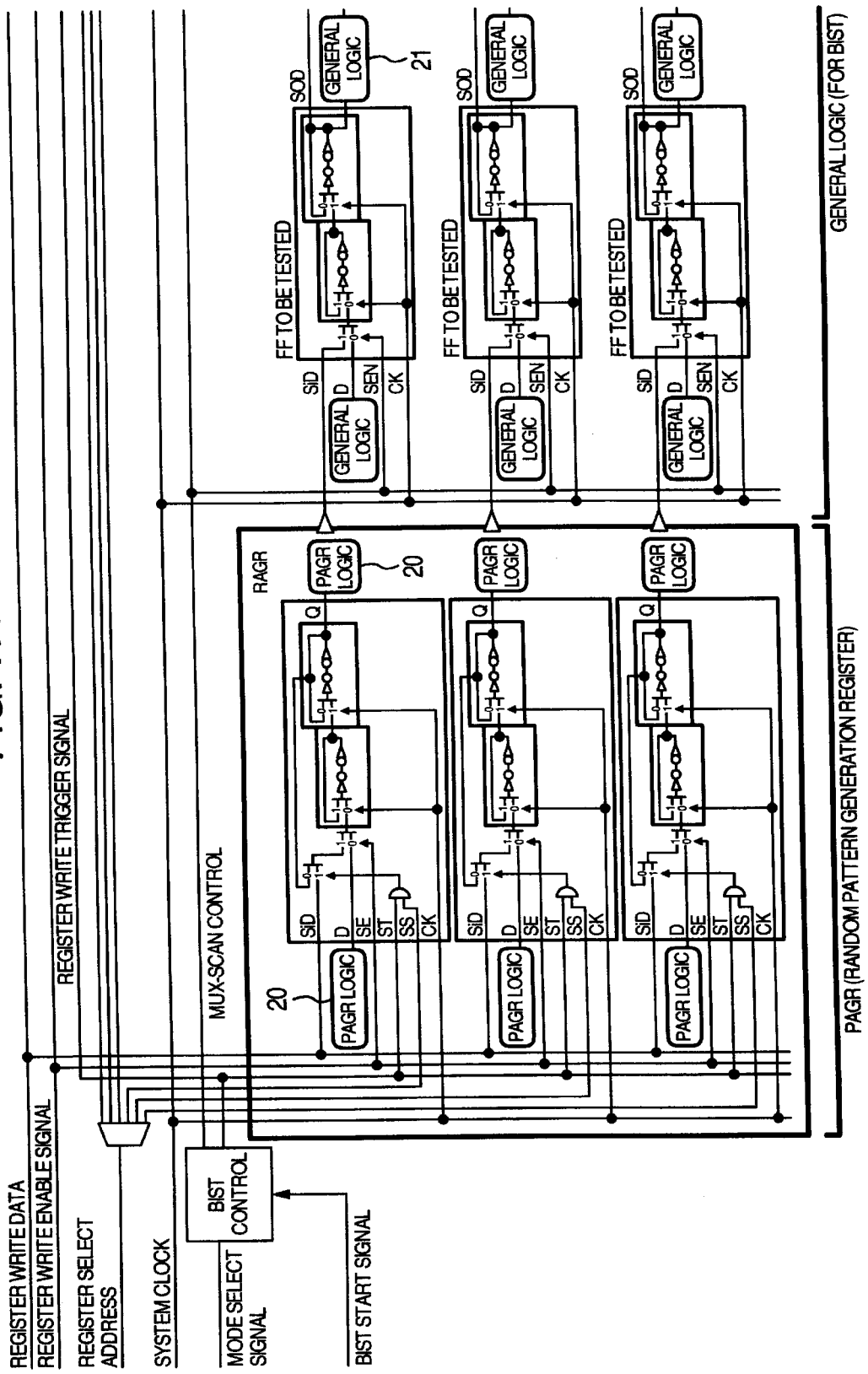
FIGS. 7A and 7B represent a block diagram showing a semiconductor integrated circuit device according to an embodiment of the invention.
Figure 7B:
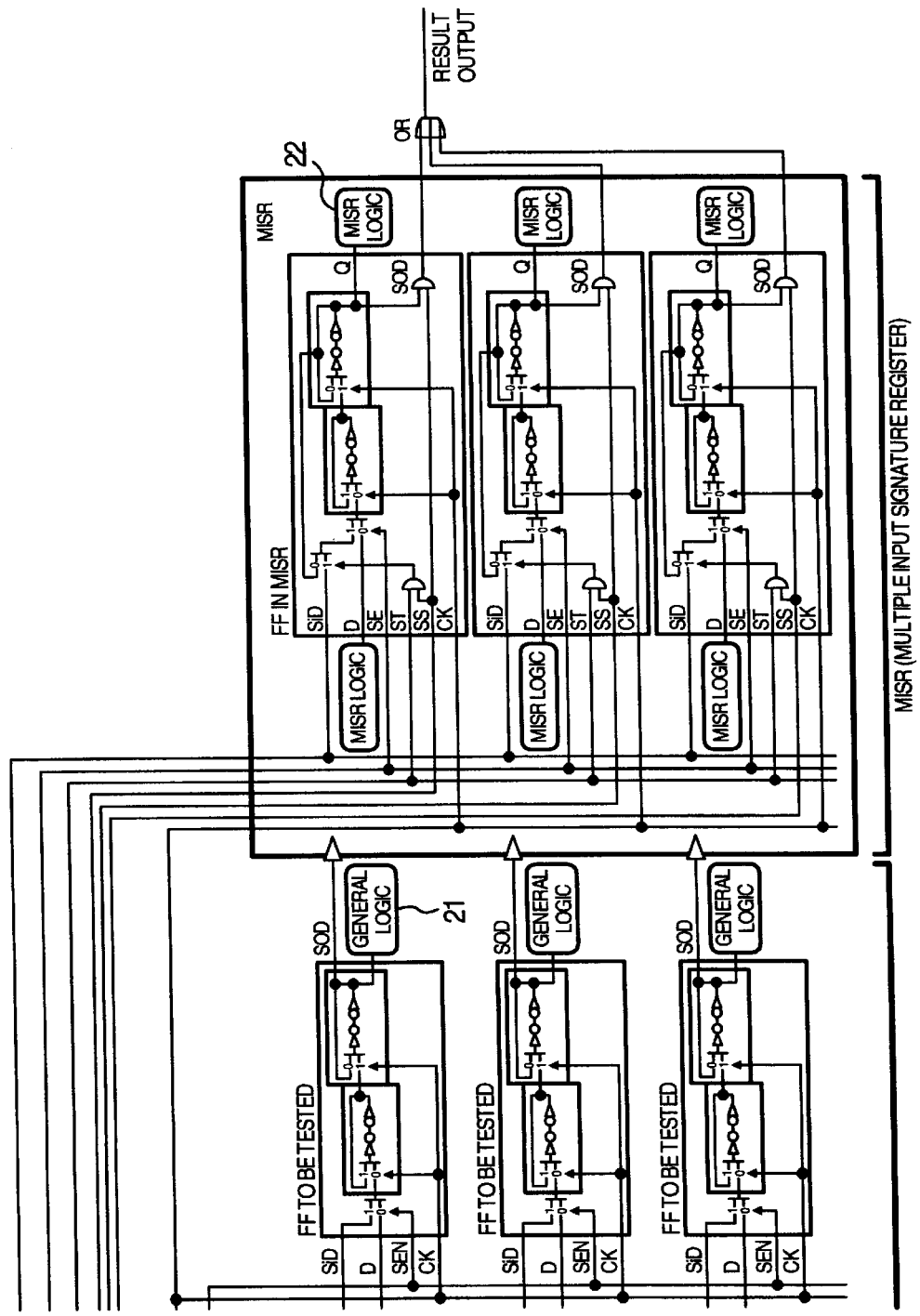

FIGS. 7A and 7B represent a block diagram showing a semiconductor integrated circuit device according to another embodiment of the invention. This embodiment represents a semiconductor integrated circuit device built in a BIST circuit for a logic circuit (hereinafter referred to as the "LOGIC-BIST circuit"). The semiconductor integrated circuit device according to this embodiment is configured of the circuit blocks described below.

Specifically, the semiconductor integrated circuit device according to this embodiment comprises a pseudo random pattern generation register (PAGR) and a multiple input signature register (MISR). The register included in the random pattern generation register or the multiple input signature register, like the register shown with the RAM-BIST of FIGS. 6A and 6B, includes means for performing the write or read operation at a frequency lower than the LSI clock (LSI machine cycle) with the latter kept supplied.

Specifically, the register select address formed in a register address generation counter not shown is decoded by a decoder and input to the SS terminal of each register. The data to be written into the register described above is supplied to the SID terminal, the enable signal for writing into the register is supplied to the SE terminal, and the trigger signal for writing into the register formed by the BIST control circuit is supplied to the ST terminal.

The random pattern generation register (PAGR) generates a test pattern through a PAGR logic circuit 20 based on these data written into the register. According to this embodiment, a general logic 21 to be tested by the BIST circuit is divided into a plurality of blocks. The flip-flop circuit inserted between input and output of this general logic constitutes a flip-flop (FF) to be tested (the register shown in FIGS. 3A to 3C) having the input function and the output function for the test.

The flip-flops to be tested (registers) corresponding to the general logic 21 divided into a plurality of the blocks described above are connected serially to each other for each block using the input SID and the output SDO for the test. Therefore, there are provided a plurality of random pattern generation registers (PAGR) corresponding to the blocks. In similar fashion, there are provided a plurality of multiple input signature registers (MISR) corresponding to the flip-flops (FF) (registers) to be tested which are divided into blocks. The random pattern generation register (PAGR) and the multiple input signature register (MISR) are well known and will not be described in detail.

Figure 8:
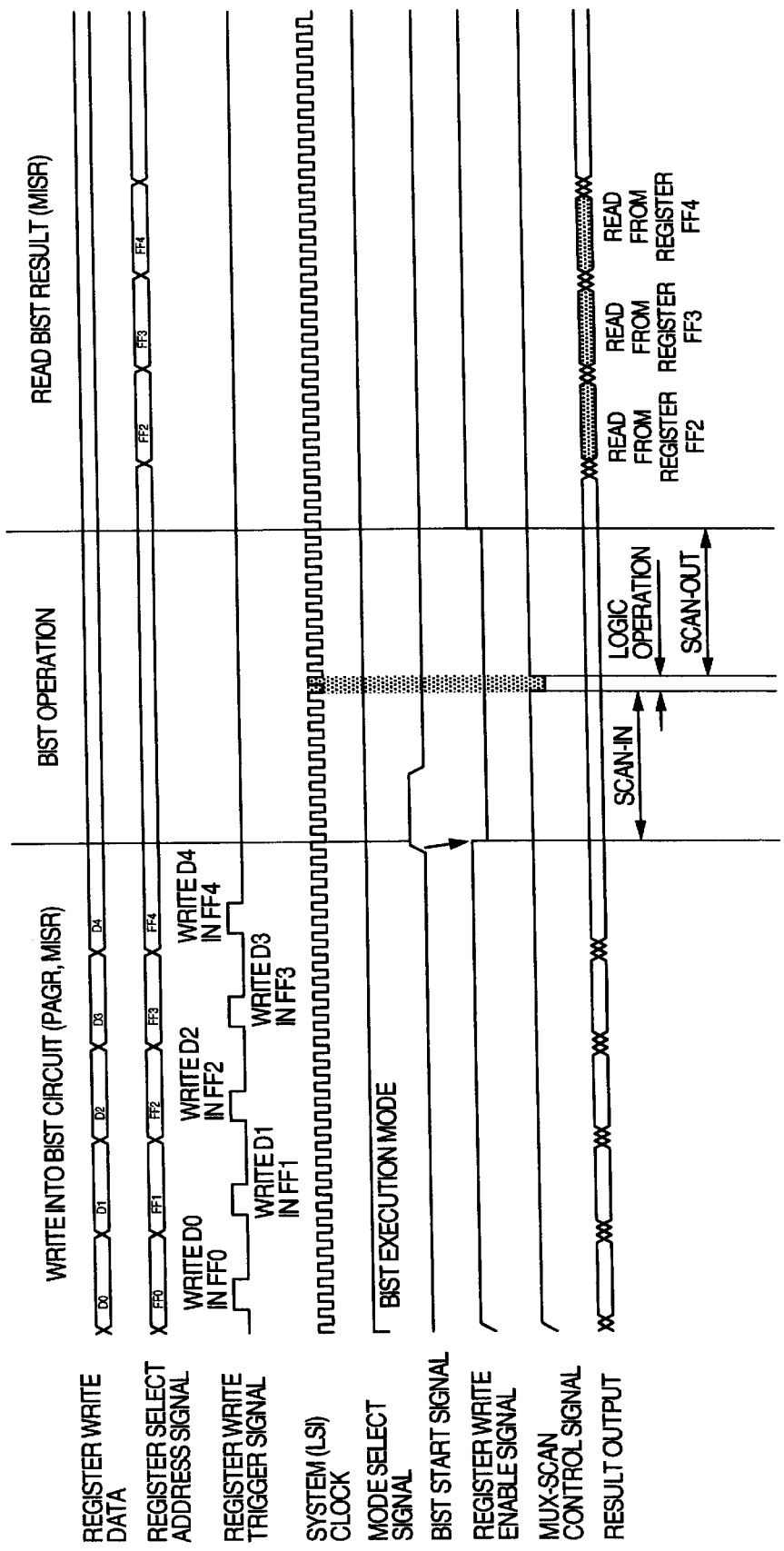
FIG. 8 is a timing chart for explaining the embodiment shown in FIGS. 7A and 7B.

Now, the operation of the LOGIC-BIST circuit according to this embodiment will be explained with reference to the timing chart of FIG. 8. The control operation of the random pattern generation register (PAGR) and the multiple input signature register (MISR), i.e. the write/read operation of the flip-flops (registers) in PAGR and MISR are performed by the register write data signal (SID), the register write enable signal (SE), the register select address signal (SS) and the register write trigger signal (ST) in the same manner as in the embodiment described above.

Upon completion of this setting operation, the BIST operation is started by the BIST start signal. In the BIST operation, the SCAN-IN operation is performed first of all. The test pattern generated in the random pattern generation register (PAGR) is serially transmitted under the MUX-SCAN control to all the flip-flops to be tested of the logic circuit of the LSI. At the same time, the register write trigger signal ST is required to be controlled in synchronism with the clock and generated by the BIST control circuit supplied with the mode select signal and the BIST start trigger signal.

Once the aforementioned SCAN-IN operation is complete, the BIST control circuit reduces the MUX-SCAN control signal to low level for one period of the system clock. As a result, the input to the flip-flop to be tested is switched from the MUX-SCAN chain to the general logic 21 to carry out the logic operation, and the resulting output signal is held in the flip-flop to be tested. The MUX-SCAN control signal is raised to high level, so that the SCAN-OUT operation is entered and the output signal of the general logic 21 is serially input to the general logic 21 of the multiple input signature register (MISR). Thus, the compressed data is held by the flip-flop (register) in the MISR. The register write enable signal is raised to high level, and the MISR is read using the register select address signal (SS).

The LOGIC-BIST circuit according to this embodiment can coexist with the RAM-BIST circuit shown in FIGS. 6A and 6B. Also, the RAM-BIST can be built in the general logic shown in FIGS. 7A and 7B. In this case, the logic diagnosis of the RAM-BIST circuit can be carried out using the LOGIC-BIST circuit.

Figure 9:
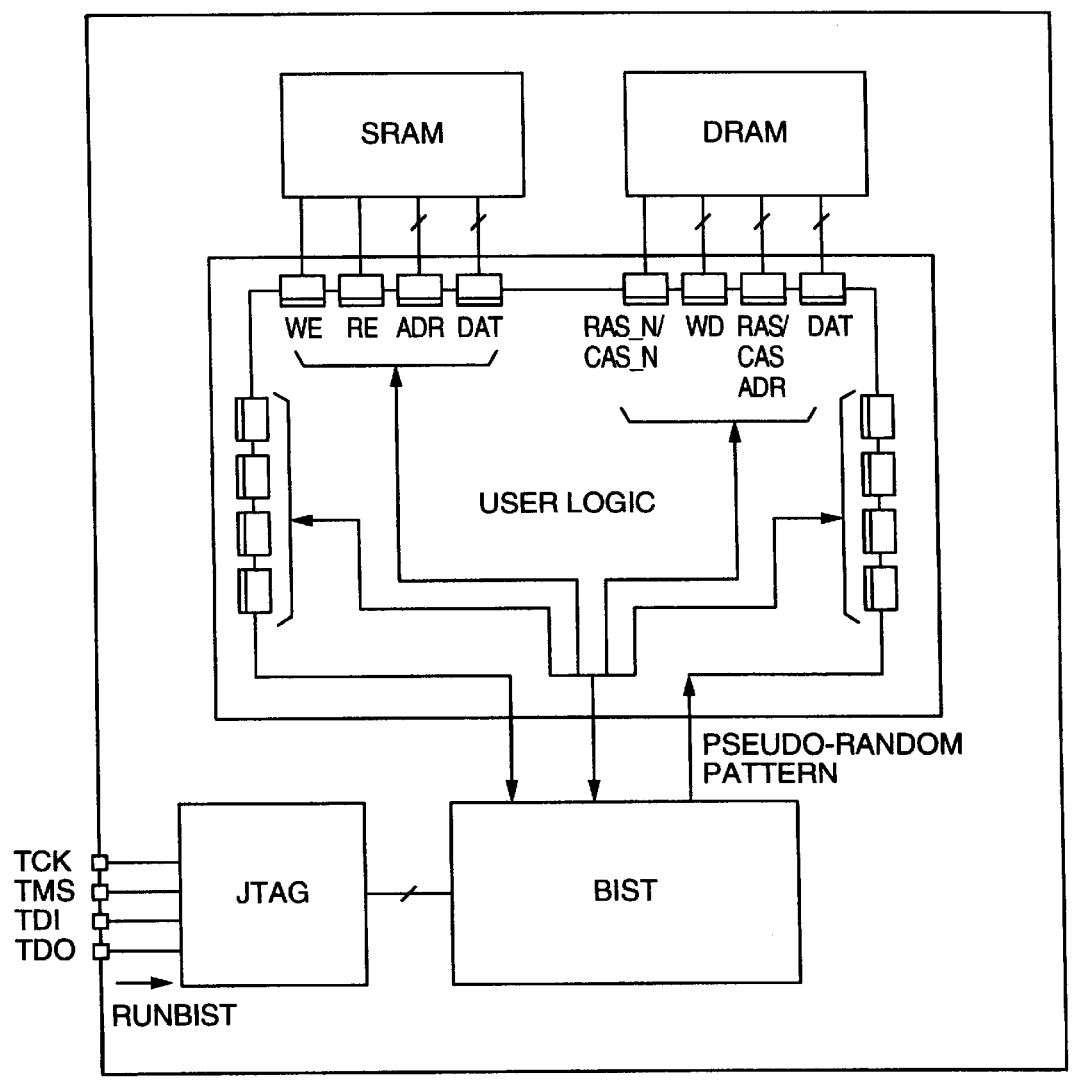
FIG. 9 is a block diagram showing a semiconductor integrated circuit device according to an embodiment of the invention.

FIG. 9 is a block diagram showing a semiconductor integrated circuit device according to still another embodiment of the invention. The semiconductor integrated circuit device according to this embodiment, though not specifically limited, comprises a DRAM (dynamic random access memory), a SRAM (static random access memory), a user logic for controlling the DRAM and the SRAM, a BIST circuit and an interface circuit JTAG. The interface circuit JTAG is adapted to input and output the mode setting signal TMS, the test input data TDI and the test output data TDO serially in synchronism with the clock terminal TCK.

Though not specifically limited, the DRAM includes a DRAM core having a storage capacity as large as 64 K words by 288 bits (about 18.4 M bits), four registers each having a storage capacity of 72 bits for writing into the DRAM core, and four registers each having a storage capacity of 72 bits for read operation. The SRAM has the function as a buffer register for input/output operation, and though not specifically limited, includes four write ports each having a capacity of 128 words by 72 bits and four read ports each having a capacity of 128 words by 72 bits. The user logic includes an input/output interface unit for inputting/outputting in units of 72 bits and a multiplexer for transmitting 72-bit data each time between the SRAM and the DRAM.

The BIST circuit (test circuit) includes a MUX-SCAN path for supplying a test pattern serially to a latch circuit making up a chain of registers with the user logic and supplying signals in parallel for giving an operating instruction to the user logic, DRAM and the SRAM, and a test path for the "pseudo clock asynchronous operation" according to the invention. As a result, the DRAM, the SRAM and the user logic have the electronic circuit (internal circuit) thereof activated by the test pattern supplied from the BIST circuit in the operation mode of either the MUX-SCAN or the "pseudo clock asynchronous operation" as required thereby to make determination.

The functions and effects acquired from the embodiments described above are as follows:

(1) The semiconductor integrated circuit device according to the invention comprises a test circuit including a first latch circuit for holding a test pattern input to the electronic circuit or internal circuit operated in accordance with the clock signal and a second latch circuit for holding the output signal of the electronic circuit in accordance with the test pattern, wherein the clock signal having a higher frequency than the noise frequency generated in the power line at the time of starting to supply the clock signal to the electronic circuit (internal circuit) is continuously supplied to the electronic circuit and the test circuit, while at the same time performing the operation of inputting the test pattern to the first latch circuit and the operation of outputting an output signal held in the second latch circuit, in accordance with the clock signal for a period longer than the clock period, thereby making it possible to conduct the test with a stable power supply free of the effect of the large power noises due to start/stop or the speed change of the clock.

(2) In addition, the electronic circuit is used as a memory circuit supplied with a test pattern including an address signal and an operation control signal, and the read signal for the memory circuit is introduced into the second latch circuit. In this way, the memory circuit can be tested independently of the logic circuit in the memory circuit thereby to shorten the test time.

(3) In addition, the clock signal for the test operation is set to a frequency corresponding to the normal operating condition of the memory circuit. In this way, a test conforming with the actual circuit operation can be carried out, thereby making it possible to produce a highly reliable determination result.

(4) In addition, the test circuit includes a test pattern generating circuit for generating a test pattern supplied to the memory circuit and an expected value of the test pattern, a switching circuit for switching between the test pattern input held in the first latch circuit and the input for the normal operation, and a comparison circuit for comparing the output signal of the second latch circuit read from the memory circuit with the expected value. Thus, a simplified tester can be used.

(5) In addition, the test circuit further includes a relief analysis circuit for determining whether the relief is required or not in response to the determination output of the comparison circuit and the address signal input to the memory circuit, and a relief address register for holding the relief address in the relief analysis circuit. Thus, the memory circuit can be provided with a redundancy function.

(6) In addition, a plurality of the memory circuits are provided, and the test circuit further includes a memory select circuit for designating a memory circuit to be tested among the plurality of the memory circuits. Thus, the test circuit can be simplified.

(7) In addition, the electronic circuit is composed of a logic circuit, and the first and second latch circuits are built in the flip-flop circuits arranged at the input unit and the output unit of the logic circuit. In this way, the logic circuit can be tested with a smaller number of test patterns.

(8) In addition, the clock signal for the test operation is set to a frequency corresponding to the normal operating condition of the electronic circuit. In this way, a test conforming with the actual circuit operation can be conducted, and a highly reliable determination result can be obtained.

(9) In addition, the test circuit further includes a random pattern generation register for forming an input signal supplied to the first latch circuit arranged at the input unit of the logic circuit and a multiple input signature register for receiving the output signal of the second latch circuit for holding the output signal of the logic circuit. In this way, the determination of the internal logic circuit can be made using a simple tester.

(10) In addition, the internal logic circuit is divided into a plurality of blocks each including a plurality of flip-flop circuits connected in series to each other through a first latch circuit and a second latch circuit. A test pattern is input serially to the first latch circuit from the corresponding random pattern generation register. The output signal of the second latch circuit corresponding to the particular test pattern is output serially to the multiple input signature register. In this way, the logic circuit can be verified in parallel and therefore the test time can be shortened.

(11) A test circuit includes a first latch circuit for holding the test pattern input to the electronic circuit operated in accordance with the clock signal and a second latch circuit for holding the output signal of the electronic circuit in accordance with the particular test pattern. The clock signal having a frequency higher than the noise frequency generated in the power line when the clock signal starts to be supplied to the electronic circuit is continuously supplied to the electronic circuit and the test circuit. The operation of inputting the test pattern to the first latch circuit and the operation of outputting the output signal held in the second latch circuit are performed in accordance with the clock signal but with a period longer than the clock signal. In this way, the test can be conducted with a stable power without being affected by the large power noise caused by the start/stop or changing the speed of the clock.

(12) In addition, the electronic circuit makes up a memory circuit, and the test pattern including the address signal and the operation control signal is input, and the read signal for the memory circuit is applied to the second latch circuit. In this way, the memory circuit can be tested independently of the internal logic circuit, thereby shortening the test time.

(13) In addition, the electronic circuit is constituted of a logic circuit, and the first and second latch circuits are built in the flip-flop circuits arranged at the input unit and the output unit of the logic circuit. In this way, the logic circuit can be tested with a smaller number of test patterns.

(14) In addition, the clock signal for the test operation is set to a frequency corresponding to the normal operating condition of the electronic circuit. In this way, a test conforming with the actual circuit operation can be carried out, thereby making it possible to obtain a highly reliable determination result.

The invention achieved by the present inventor has been specifically described above with reference to embodiments. Nevertheless, the invention is not limited to these embodiments, but of course can be variously modified without departing from the spirit thereof. The address of the register, for example, can be generated or selected in various forms. The register may not have the input/output function for MUX-SCAN control. The frequency of the clock signal may be lower than the frequency for the actual operating condition depending on the test environment. In the case where it is difficult to supply the clock of a frequency as high as for the actual operating condition in the probing operation upon completion of the LSI on the semiconductor wafer, for example, the device may be operated by supplying a lower frequency. It is, however, necessary to secure a sufficiently high frequency as compared with the resonance frequency of the prevailing power system. This invention finds wide applications in various semiconductor integrated circuit devices including logic circuits and memory circuits and the method of testing the same.

As described above, according to this invention, there is provided semiconductor integrated circuit device comprising a test circuit including a first latch circuit for holding a test pattern input to the electronic circuit operating in accordance with a clock signal and a second latch circuit for holding the output signal of the electronic circuit corresponding to the test pattern, wherein the clock signal having a frequency higher than the noise frequency generated in the power line at the time of starting to supply the clock signal to the electronic circuit is continuously supplied to the electronic circuit and the test circuit, while at the same time performing the operation of inputting the test pattern to the first latch circuit and the operation of outputting the output signal held in the second latch circuit, in accordance with the clock signal but with a longer period than the clock signal. In this way, the test can be carried out with a stable power supply without being affected by the large power noise caused by starting/stopping or changing the speed of the clock.

Also, according to this invention, there is provided a method of testing a semiconductor integrated circuit device using a test circuit including a first latch circuit for holding a test pattern input to the electronic circuit operating in accordance with a clock signal and a second latch circuit for holding the output signal of the electronic circuit corresponding to the test pattern, wherein the clock signal having a frequency higher than the noise frequency generated in the power line at the time of starting to supply the clock signal to the electronic circuit is continuously supplied to the electronic circuit and the test circuit, while at the same time performing the operation of inputting the test pattern to the first latch circuit and the operation of outputting the output signal held in the second latch circuit, in accordance with the clock signal but with a longer period than the clock signal. In this way, the test can be carried out with a stable power supply without being affected by the large power noise caused by starting/stopping or changing the speed of the clock.

What is claimed is:

1. A semiconductor integrated circuit device comprising:
    an electronic circuit operating in accordance with a clock signal; and
    a test circuit including a first latch circuit for holding the test pattern input to said electronic circuit and a second latch circuit for holding the output signal of the electronic circuit corresponding to said test pattern;
    wherein said test circuit performs the operation of inputting the test pattern to said first latch circuit and the operation of outputting an output signal held in said second latch circuit in a period corresponding to and longer than said clock signal while said electronic circuit and said test circuit are continuously supplied with said clock signal having a frequency higher than the frequency of the noise generated in the power line at the time of starting to supply the clock signal to said electronic circuit.

2. A semiconductor integrated circuit device according to claim 1,
    wherein said electronic circuit is a memory circuit built in said semiconductor integrated circuit device,
    wherein said test pattern includes an operation control signal and an address signal supplied to said memory circuit, and
    wherein the output signal applied to said second latch circuit is a signal for reading said memory circuit.

3. A semiconductor integrated circuit device according to claim 2,
    wherein the clock signal for said test operation has a frequency corresponding to the normal operating condition of said memory circuit.

4. A semiconductor integrated circuit device according to claim 2, wherein said test circuit further includes
    a test pattern generating circuit for generating a test pattern supplied to said memory circuit and an expected value of said test pattern,
    a switching circuit for switching between the input of the test pattern held in said first latch circuit and the input for the normal operation, and
    a comparison circuit for comparing the output signal of said second latch circuit read from said memory circuit with said expected value.

5. A semiconductor integrated circuit device according to claim 4, wherein said test circuit further includes
    a relief analysis circuit for determining whether the relief is required in response to the determination output of said comparison circuit and the address signal input to said memory circuit, and
    a relief address register for holding the relief address in said relief analysis circuit.

6. A semiconductor integrated circuit device according to claim 4, comprising a plurality of said memory circuits,
    wherein said test circuit further includes a memory select circuit for designating a memory circuit to be tested from among said plurality of the memory circuits, said test operation being conducted for said memory circuit selected by said memory select circuit.

7. A method of testing a semiconductor integrated circuit device according to claim 1,
    wherein said electronic circuit is a logic circuit, and
    wherein said first latch circuit and said second latch circuit are built in flip-flop circuits arranged in the input unit and the output unit of said logic circuit.

8. A semiconductor integrated circuit device according to claim 7,
    wherein the clock signal for said test operation has a frequency corresponding to the normal operating condition of said electronic circuit.

9. A semiconductor integrated circuit device according to claim 7, wherein said test circuit further includes a random pattern generation register for forming an input signal supplied to said first latch circuit arranged in the input unit of said logic circuit, and a multiple input signature register for receiving the output signal of said second latch circuit for holding the output signal of said logic circuit.

10. A semiconductor integrated circuit device according to claim 9, wherein said logic circuit constituting said electronic circuit is divided into a plurality of blocks, and wherein said test circuit connects a plurality of flip-flop circuits in each of said blocks in series to each other through said first latch circuit and said second latch circuit, inputs a test pattern serially from a corresponding random pattern generation register to said first latch circuit, and causes a multiple input signature register to output the output signal of said second latch circuit corresponding to said test pattern serially.

11. A method of testing a semiconductor integrated circuit device comprising a test circuit including a first latch circuit for holding a test pattern input to an electronic circuit operating in accordance with a clock signal and a second latch circuit for holding the output signal of said electronic circuit corresponding to said test pattern, wherein the clock signal having a frequency higher than the frequency of the noise generated in the power line at the time of starting to supply the clock signal to said electronic circuit is continuously supplied to said electronic circuit and said test circuit, and wherein the operation of inputting the test pattern to said first latch circuit and the operation of outputting the output signal held in said second latch circuit are performed in accordance with said clock signal in a period longer than the period of said clock signal.

12. A method of testing a semiconductor integrated circuit device according to claim 11, wherein said electronic circuit is a memory circuit built in said semiconductor integrated circuit device, wherein said test pattern includes an address signal and an operation control signal supplied to said memory circuit, and wherein the output signal applied to said second latch circuit is a signal for reading said memory circuit.

13. A method of testing a semiconductor integrated circuit device according to claim 11, wherein said electronic circuit is a logic circuit, and wherein said first latch circuit and said second latch circuit are built in the flip-flop circuits arranged in the input unit and the output unit of said logic circuit.

14. A method of testing a semiconductor integrated circuit device according to claim 11, wherein said clock signal for said test operation has a frequency corresponding to the normal operating condition of said electronic circuit.

* * * * *